United States Patent
Takaichi et al.

(10) Patent No.: US 11,029,599 B2
(45) Date of Patent: Jun. 8, 2021

(54) CHEMICALLY AMPLIFIED POSITIVE PHOTORESIST COMPOSITION AND PATTERN FORMING METHOD USING SAME

(71) Applicant: Ridgefield Acquisition, Luxembourg (LU)

(72) Inventors: Tetsumasa Takaichi, Kakegawa (JP); Shunji Kawato, Kakegawa (JP); Masato Suzuki, Kakegawa (JP); Kazumichi Akashi, Kakegawa (JP); Tomohide Katayama, Kakegawa (JP)

(73) Assignee: Merck Patent GmbH, Darmstadt (DE)

( * ) Notice: Subject to any disclaimer, the term of this patent is extended or adjusted under 35 U.S.C. 154(b) by 241 days.

(21) Appl. No.: 16/340,413

(22) PCT Filed: Oct. 10, 2017

(86) PCT No.: PCT/EP2017/075738
§ 371 (c)(1),
(2) Date: Apr. 9, 2019

(87) PCT Pub. No.: WO2018/069274
PCT Pub. Date: Apr. 19, 2018

(65) Prior Publication Data
US 2019/0235382 A1 Aug. 1, 2019

(30) Foreign Application Priority Data

Oct. 12, 2016 (EP) .................................... 16002196

(51) Int. Cl.
| | | |
|---|---|---|
| *G03F 7/004* | (2006.01) | |
| *G03F 7/039* | (2006.01) | |
| *G03F 7/38* | (2006.01) | |
| *G03F 7/40* | (2006.01) | |
| *C08F 212/08* | (2006.01) | |
| *C08F 212/12* | (2006.01) | |
| *G03F 7/16* | (2006.01) | |
| *G03F 7/20* | (2006.01) | |
| *G03F 7/32* | (2006.01) | |
| *H01L 21/027* | (2006.01) | |

(52) U.S. Cl.
CPC .......... *G03F 7/0392* (2013.01); *C08F 212/08* (2013.01); *C08F 212/12* (2013.01); *G03F 7/039* (2013.01); *G03F 7/162* (2013.01); *G03F 7/168* (2013.01); *G03F 7/2004* (2013.01); *G03F 7/322* (2013.01); *G03F 7/38* (2013.01); *G03F 7/40* (2013.01); *H01L 21/0274* (2013.01)

(58) Field of Classification Search
CPC ..... G03F 7/0392; C08F 212/08; C08F 212/12
See application file for complete search history.

(56) References Cited

U.S. PATENT DOCUMENTS

| | | | | |
|---|---|---|---|---|
| 7,255,970 | B2 * | 8/2007 | Toukhy | ................... G03F 7/022 |
| | | | | 430/191 |
| 9,316,900 | B2 * | 4/2016 | Shih | ..................... G03F 7/2004 |
| 9,523,913 | B2 * | 12/2016 | Kato | ......................... G03F 7/30 |
| 9,718,901 | B2 * | 8/2017 | Tsuruta | ................. C08F 212/24 |
| 9,829,796 | B2 * | 11/2017 | Takizawa | .............. G03F 7/0045 |
| 10,527,935 | B2 * | 1/2020 | Haga | ........................ C23C 18/38 |
| 10,890,847 | B2 * | 1/2021 | Tsuchihashi | ............ G03F 7/038 |
| 2001/0021479 | A1 * | 9/2001 | Kawabe | ................ G03F 7/0045 |
| | | | | 430/170 |
| 2004/0131964 | A1 | 7/2004 | Furihata et al. | |
| 2012/0184101 | A1 | 7/2012 | Yasuda et al. | |
| 2013/0330669 | A1 | 12/2013 | Kawamura et al. | |
| 2015/0355542 | A1 * | 12/2015 | Cameron | .................. G03F 7/16 |
| | | | | 430/270.1 |
| 2015/0355543 | A1 * | 12/2015 | Takemura | ................. G03F 7/38 |
| | | | | 430/270.1 |
| 2017/0166737 | A1 * | 6/2017 | Adachi | ................... G03F 7/094 |

FOREIGN PATENT DOCUMENTS

| | | |
|---|---|---|
| EP | 1669803 A2 | 6/2006 |
| EP | 2955576 A1 | 12/2015 |
| JP | 2004198915 A | 7/2004 |
| JP | 2007248727 A | 9/2007 |
| WO | WO-2007007176 A2 | 1/2007 |
| WO | WO-2007054813 A2 | 5/2007 |

OTHER PUBLICATIONS

International Search Report for PCT/EP2017/075738 dated Dec. 14, 2017.
Written Opinion of the International Searching Authority for PCT/EP2017/075738 dated Dec. 14, 2017.

* cited by examiner

*Primary Examiner* — Amanda C. Walke
(74) *Attorney, Agent, or Firm* — Faegre Drinker Biddle & Reath LLP

(57) ABSTRACT

The present invention relates to a photosensitive resin composition suitable for forming a thick film, which comprises (A) an alkali-soluble resin, (B) at least one plasticizer selected from a group consisting of an alkali-soluble vinyl resin and an acid-dissociable group containing vinyl resin, (C) an acid generator, and (D) an organic solvent.

9 Claims, No Drawings

CHEMICALLY AMPLIFIED POSITIVE PHOTORESIST COMPOSITION AND PATTERN FORMING METHOD USING SAME

CROSS-REFERENCE TO RELATED APPLICATIONS

This application is a national stage application (under 35 U.S.C. § 371) of PCT/EP2017/075738, filed Oct. 10, 2017, which claims benefit of European Application No. 16002196.0, filed Oct. 12, 2016, both of which are incorporated herein by reference in their entirety.

FIELD OF THE INVENTION

The present invention relates to a chemically amplified positive photoresist composition, more specifically suitable for forming a thick film appropriately used in producing a semiconductor device, a flat panel display (FPD), a circuit board, and a magnetic head, in particular, in forming the magnetic pole of a magnetic head and the protuberance electrode called "bump" for use as a connecting terminal in a large-scale integrated circuit (LSI).

BACKGROUND OF THE INVENTION

Photolithographic technology has been used in forming microelements or carrying out a fine processing in a variety of fields, for example, in production of semiconductor integrated circuits such as LSIs, display screens of FPDs, circuit boards for thermal heads, and others. In the fields demanding a thick film processing such as magnetic head and bump, it is necessary to form a resist pattern having a high-aspect ratio and perpendicular wall. Furthermore, a photoresist film works as a mask for ion beam when the silicon substrate is processed for etching and/or ion implantation. A thicker photoresist film shows better shielding effect. These processes for the silicon substrate are implemented in a production of a complementary metal oxide semiconductor (CMOS) image sensor and a flash memory.

A certain value of viscosity is needed for a photoresist composition in order to form a thick film. A demand for low viscosity photoresist composition used for a thick film formation is increasing. A thick photoresist film formed from a high viscosity composition has problems on large variation and plane uniformity on film thickness. A high viscosity photoresist composition also has problems on handling due to a certain amount of waste composition and difficulty in adjusting a coating condition. Moreover, an equipment modification on piping, pump and nozzle is necessary to use a high viscosity photoresist composition in a mass production coater.

A positive photoresist composition comprising a novolak resin and a naphthoquinonediazide-containing compound is known to form a film thickness of several tens of micrometer (Japanese Patent Application Laid Open (JP-A) No. 2004-198915). However, the composition has an issue on tapered profile of sidewall due to an insufficient sensitivity. A chemically amplified positive photoresist composition for thick-film resist film formation comprising a mixture of organic solvent is known to be capable of reducing viscosity (Japanese Patent Application Laid Open (JP-A) No. 2007-248727). However, film thickness derived from the composition comprising a mixture of organic solvent is not sufficient. A chemically amplified positive photoresist composition comprising a base resin and an acid generator in a solvent, the base resin contains both an alkali-insoluble or substantially alkali-insoluble polymer having an acid labile group-protected acidic functional group and an alkyl vinyl ether polymer is disclosed in US 2012/0184101 A1. However, film properties derived from the composition depend on a post exposure delay time. For a photolithographic process stability, it has been required to improve process margin.

Accordingly, there is a need for preparing a thick chemically amplified positive photoresist film, which can be developed to form a pattern at high sensitivity, high resolution, vertical profile, and short development time, and stable after exposure process. In particular, it would be advantageous to provide compositions with low viscosity. The present disclosure addresses these needs.

SUMMARY OF THE INVENTION

An object of the invention is to provide a chemically amplified positive photoresist composition with low viscosity useful for a thick film photoresist material subject to a subsequent pattern forming process, which forms a pattern with advantages including a high sensitivity, high resolution, vertical profile, and short development time, and in which the pattern exhibits crack resistance and is free of deformation during or after the pattern forming process.

In one aspect, the invention provides a chemically amplified positive photoresist composition comprising (A) an alkali-soluble resin, (B) at least one plasticizer selected from a group consisting of an alkali-soluble vinyl resin and an acid-dissociable group containing vinyl resin, (C) an acid generator, and (D) an organic solvent. The alkali-soluble resin (A), selected from a group consisting of a block copolymer, a random copolymer and those combination, comprising a polymer comprising recurring units represented by a following general formula (1), a following general formula (2) and a following general formula (3) and having a weight average molecular weight of 1,000 to 200,000. In one embodiment of the invention, the alkali-soluble vinyl resin and the acid-dissociable group containing vinyl resin (B) has a weight average molecular weight of 500 to 200,000. In one embodiment of the invention, the component (B) is included in an amount of 2-10 parts by mass per 100 parts by mass of the component (A).

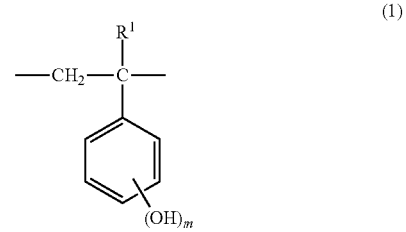

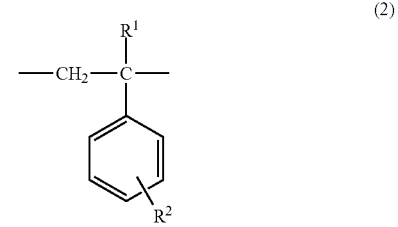

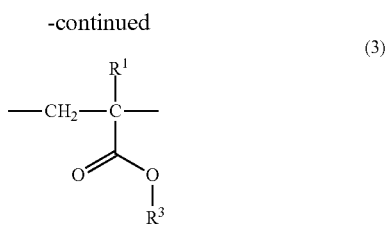

(3)

Herein R1 is hydrogen, alkyl or halogen, R2 is hydrogen or alkyl, R3 is C4-C12 tertiary alkyl, m is a positive integer of 1 to 5.

In one embodiment of the invention, the alkali-soluble resin (A) comprises 5 to 80 mass % of the recurring units represented by the above general formula (1), 1 to 35 mass % of the recurring units represented by the above general formula (2), 5 to 55 mass % of the recurring units represented by the above general formula (3), based on mass of the alkali-soluble resin (A).

In a preferred embodiment, the polymer comprising recurring units represented by the above general formula (1), the above general formula (2) and the above general formula (3) included in the alkali-soluble resin (A) is a polymer comprising recurring units represented by a following formula (4), a following formula (5) and a following formula (6) and having a weight average molecular weight of 4,000 to 200,000.

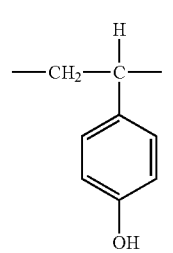

(4)

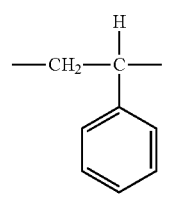

(5)

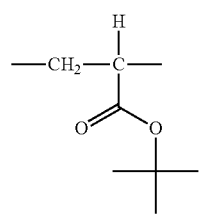

(6)

The chemically amplified positive photoresist composition may further comprise (E) a basic compound optionally.

The organic solvent of the chemically amplified positive photoresist composition comprises a solvent with viscosity less than 1.0 mPa·s at 25° C., in one embodiment of the invention.

In another aspect, the invention provides a method for forming a resist pattern, comprising;

a) coating the chemically amplified positive photoresist composition according to claim 1 onto a substrate and prebaking to form a resist film;

b) exposing the resist film to UV radiation having a wavelength of up to 500 nm through a photomask; and c) optionally baking, and developing with a developer to form a resist pattern.

Typically, the wavelength of UV radiation is 248 nm.

In still another aspect, the invention provides a method for forming a semiconductor device manufacturing method comprising a method for forming a resist pattern from the chemically amplified positive resist composition.

The chemically amplified positive resist composition of the invention, having viscosity of less than 100 mPa·s, is coated onto a substrate to form a relatively thick resist film of 2 to 20 μm thick with excellent plane uniformity, which can be developed to form a pattern at high sensitivity, high resolution, vertical profile, and short development time, and in which the pattern exhibits crack resistance and is free of deformation during or after the pattern forming process.

Definitions

Unless otherwise stated, the following terms used in the specification and claims shall have the following meanings for the purpose of this Application.

In this application, the use of the singular includes the plural, and the words "a", "an" and "the" mean "at least one", unless specifically stated otherwise. Furthermore, the use of the term "including", as well as other forms such as "includes" and "included", is not limiting. Also, terms such as "element" or "component" encompass both elements or components comprising one unit and elements or components that comprise more than one unit, unless specifically stated otherwise. As used herein, the conjunction "and" is intended to be inclusive and the conjunction "or" is not intended to be exclusive, unless otherwise indicated. For example, the phrase "or, alternatively" is intended to be exclusive. As used herein, the term "and/or" refers to any combination of the foregoing elements including using a single element.

The term "about" or "approximately," when used in connection with a measureable numerical variable, refers to the indicated value of the variable and to all values of the variable that are within the experimental error of the indicated value (e.g., within the 95% confidence limit for the mean) or within ±10 percent of the indicated value, whichever is greater.

As used herein, "$C_{x-y}$" designates the number of carbon atoms in a chain. For example, $C_{1-6}$ alkyl refers to an alkyl chain having a chain of between 1 and 6 carbons (e.g., methyl, ethyl, propyl, butyl, pentyl and hexyl).

The section headings used herein are for organizational purposes and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that one or more of the incorporated literature and similar materials defines a term in a manner that contradicts the definition of that term in this application, this application controls.

DETAILED DESCRIPTION

It is to be understood that both the foregoing general description and the following detailed description are illustrative and explanatory, and are not restrictive of the subject matter, as claimed.

One embodiment of the invention is a chemically amplified positive photoresist composition comprising (A) an alkali-soluble resin, (B) at least one plasticizer selected from a group consisting of an alkali-soluble vinyl resin and an acid-dissociable group containing vinyl resin, (C) an acid generator, and (D) an organic solvent. The alkali-soluble resin (A), selected from a group consisting of a block copolymer, a random copolymer and those combination, comprising a polymer comprising recurring units represented by a following general formula (1), a following general formula (2) and a following general formula (3) and having a weight average molecular weight of 1,000 to 200,000. The alkali-soluble vinyl resin and the acid-dissociable group containing vinyl resin (B) has a weight average molecular weight of 500 to 200,000. The component (B) is included in an amount of 2-10 parts by mass per 100 parts by mass of the component (A).

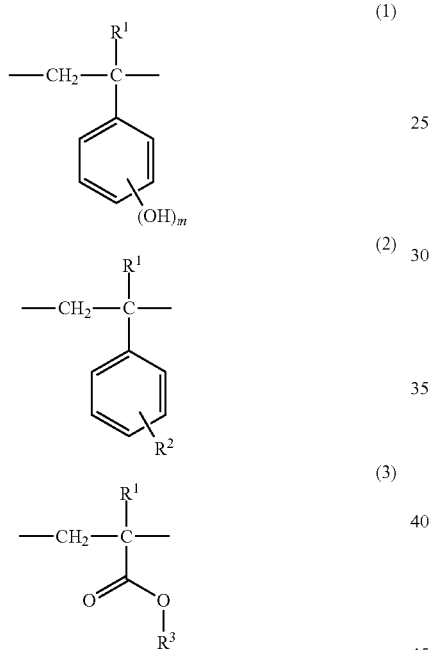

Herein R1 is hydrogen, alkyl or halogen, R2 is hydrogen or alkyl, R3 is C4-C12 tertiary alkyl, m is a positive integer of 1 to 5.

The alkyl groups represented by R1 and R2 are typically those of 1 to 6 carbon atoms, preferably 1 to 4 carbon atoms, for example, methyl, ethyl, propyl, isopropyl, n-butyl, isobutyl, and tert-butyl. R1 may be halogen. Exemplary halogens are fluorine, chlorine and bromine.

Examples of the tertiary alkyl group represented by R3 include tert-butyl, tert-amyl, tert-hexyl, tert-heptyl, tert-octyl, tert-nonyl, tert-decyl, tert-undecyl, and tert-dodecyl.

The alkali-soluble resin (A) comprises 5 to 80 mass % preferably 5 to 75 mass % of the recurring units represented by the above general formula (1), 1 to 35 mass % preferably 1 to 30 mass % of the recurring units represented by the above general formula (2), 5 to 55 mass % preferably 5 to 50 mass % of the recurring units represented by the above general formula (3), based on mass of the alkali-soluble resin (A).

If the recurring units represented by the above general formula (1) exceeds 80 wt %, the unexposed area of a photoresist film may have too large alkali dissolution rate. If the recurring units represented by the above general formula (2) exceeds 35 wt %, the exposed area of a photoresist film may have too small alkali dissolution rate and result in deterioration of resolution. If the recurring units represented by the above general formula (3) exceeds 55 wt %, a photoresist film may show low dry etching resistance.

The alkali-soluble resin (A) should have a weight average molecular weight (Mw) of 1,000 to 200,000, preferably 2,000 to 200,000, determined by gel permeation chromatography (GPC) using GPC columns and under analysis conditions involving a flow rate of 1.0 mL/min, an elution solvent of tetrahydrofuran and a column temperature of 40° C. using mono-dispersed polystyrene as a standard. When the Mw is too small, the photoresist film may show low heat resistance. When the Mw is too large, the photoresist film may show small alkali dissolution rate and result in a footing phenomenon after pattern formation.

The polymer comprising recurring units of the general formula (1), the general formula (2) and the general formula (3) is preferably a polymer comprising recurring units represented by a formula (4), a formula (5) and a formula (6) and having a Mw of 4,000 to 200,000.

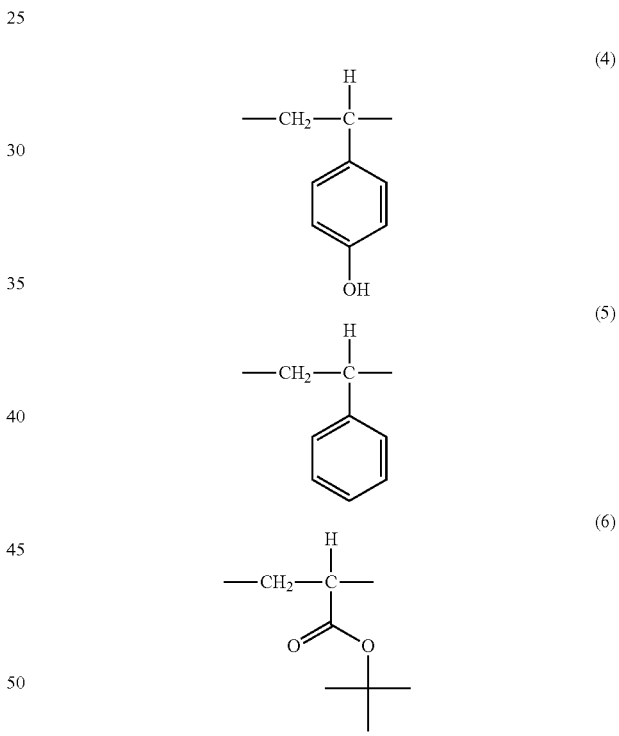

The alkali-soluble resin (A) comprising a polymer comprising recurring units represented by the general formula (1), the general formula (2) and the general formula (3) may be synthesized by any desired method, for example, by dissolving a hydroxystyrene, acrylic acid tertiary ester, and styrene monomers in an organic solvent, adding a radical initiator thereto, and effecting heat polymerization. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis (2,4-dimethylvaleronitrile), dimethyl 2,2'-azobis (2-methylpropionate), benzoyl peroxide, and lauroyl peroxide. Preferably the system is heated at 50 to 80°

C. for polymerization to take place. The reaction time is 2 to 100 hours, preferably 5 to 20 hours.

Notably, the synthesis method of the polymer is not limited to the foregoing.

An alkali-soluble vinyl resin and an acid-dissociable group containing vinyl resin used as the plasticizer (B) can be obtained from a vinyl based compound. Examples of such polymer include polyvinyl chloride, polystyrene, polyhydroxystyrene, polyvinyl acetate, polyvinyl benzoate, polyvinyl ether, polyvinyl butyral, polyvinyl alcohol, polyether ester, polyvinylpyrrolidone, polyacrylic acid, polymethacrylic acid, polyacrylic acid esters, polyimide maleate, polyacrylamide, polyacrylonitrile, polyvinylphenol and copolymers thereof, and the like. Among these alkali-soluble vinyl resins, polyvinyl ether, polyvinyl butyral and polyether ester are particularly preferred since these resins contain flexible ether bonds in the molecule.

Furthermore, in the present invention, the component (B) is preferably included in an amount of no less than 2 parts by mass per 100 parts by mass of the component (A). In particular, it is preferred that from 2 to 10 parts by mass of the component (B) per 100 parts by mass of the component (A) be included.

As the acid generator (C), a photoacid generator (PAG) is typically used. It is any compound capable of generating an acid upon exposure to high-energy radiation. Suitable PAGs include sulfonium salt, iodonium salt, sulfonyldiazomethane, and N-sulfonyloxyimide acid generators. Exemplary acid generators are given below while they may be used alone or in admixture of two or more.

Sulfonium salts are salts of sulfonium cations with anions including sulfonates and imides. Exemplary sulfonium cations include triphenylsulfonium, (4-methylphenyl)diphenylsulfonium, (4-methoxyphenyl)diphenylsulfonium, tris(4-methoxyphenyl)sulfonium, (4-tert-buthylphenyl)diphenylsulfonium, (4-tert-butoxyphenyl)diphenylsulfonium, bis(4-tert-butoxyphenyl)phenylsulfonium, tris(4-tert-buthylphenyl)sulfonium, tris(4-tert-butoxyphenyl)sulfonium, tris(4-methylphenyl)sulfonium, (4-methoxy-3,5-dimethylphenyl)dimethylsulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, (4-phenoxyphenyl)diphenylsulfonium, (4-cyclohexylphenyl)diphenylsulfonium, bis(p-phenylene)bis(diphenylsulfonium), diphenyl(4-thiophenoxyphenyl)sulfonium, diphenyl(4-thiophenylphenyl)sulfonium, diphenyl(8-thiophenylbiphenyl)sulfonium, (4-tert-butoxycarbonylmethyloxyphenyl)diphenylsulfonium, tris(4-tert-butoxycarbonylmethyloxyphenyl)sufonium, (4-tert-butoxyphenyl)bis(4-dimethylaminophenyl)sulfonium, tris(4-dimethylaminophenyl)sulfonium, 2-naphthyldiphenylsulfonium, dimethyl(2-naphthyl)sulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, and tribenzylsulfonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-(trifluoromethyl)benzenesulfonate, 4-fluorobenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, and methanesulfonate. Exemplary imides include bis (perfluoromethanesulfonyl)imide, bis(perfluoroethanesulfonyl)imide, bis(perfluorobutanesulfonyl)imide, bis(perfluorobutanesulfonyloxy)imide, bis[perfluoro(2-ethoxyethane)sulfonyl]imide, and N, N-hexafluoropropane-1,3-disulfonylimide. Exemplary other anions include 3-oxo-3H-1,2-benzothiazol-2-ide 1,1-dioxide, tris[(trifluoromethyl)sulfonyl]methaneide and tris[(perfluorobuthyl)sulfonyl]methaneide. Anion containing fluorocarbon is preferable. Sulfonium salts based on combination of the foregoing examples are included.

Iodonium salts are salts of iodonium cations with anions including sulfonates and imides. Exemplary iodonium cations include aryl iodonium cations such as diphenyliodonium, bis(4-tert-butylphenyl)iodonium, bis(4-tert-pentylphenyl)iodonium, 4-tert-butoxyphenylphenyliodonium, and 4-methoxyphenylphenyliodonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-(trifluoromethyl)benzenesulfonate, 4-fluorobenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, and methanesulfonate. Exemplary imides include bis(perfluoromethanesulfonyl)imide, bis(perfluoroethanesulfonyl)imide, bis(perfluorobutanesulfonyl)imide, bis(perfluorobutanesulfonyloxy)imide, bis[perfluoro(2-ethoxyethane)sulfonyl]imide, and N, N-hexafluoropropane-1,3-disulfonylimide. Exemplary other anions include 3-oxo-3H-1,2-benzothiazol-2-ide 1,1-dioxide, tris[(trifluoromethyl)sulfonyl]methaneide and tris[(perfluorobuthyl)sulfonyl]methaneide. Anion containing fluorocarbon is preferable. Iodonium salts based on combination of the foregoing examples are included.

Exemplary sulfonyldiazomethane compounds include bissulfonyldiazomethane compounds and sulfonyl-carbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxyimide photoacid generators include combinations of imide skeletons with sulfonates. Exemplary imide skeletons are succinimide, naphthalene dicarboxylic acid imide, phthalimide, cyclohexyldicarboxylic acid imide, 5-norbornene-2,3-dicarboxylic acid imide, and 7-oxabicyclo[2.2.1]-5-heptene-2,3-dicarboxylic acid imide. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Benzoinsulfonate photoacid generators include benzoin tosylate, benzoin mesylate, and benzoin butanesulfonate.

Pyrogallol trisulfonate photoacid generators include pyrogallol, phloroglucinol, catechol, resorcinol, and hydroquinone, in which all hydroxyl groups are substituted by trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, or methanesulfonate.

Nitrobenzyl sulfonate photoacid generators include 2,4-dinitrobenzyl sulfonates, 2-nitrobenzyl sulfonates, and 2,6-dinitrobenzyl sulfonates, with exemplary sulfonates including trifluoromethanesulfonate, nonafluorobutanesulfonate, heptadecafluorooctanesulfonate, 2,2,2-trifluoroethanesulfonate, pentafluorobenzenesulfonate, 4-trifluoromethyl benzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Also useful are analogous nitrobenzyl sulfonate compounds in which the nitro group on the benzyl side is substituted by trifluoromethyl.

Sulfone photoacid generators include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

Photoacid generators in the form of glyoxime derivatives include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexylsulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime.

Among these, the preferred PAGs are sulfonium salts, iodonium salts, and N-sulfonyloxyimides.

Although the optimum anion of the generated acid varies with such factors as ease of scission of the acid labile group in the polymer, an anion which is non-volatile and not extremely highly diffusive is generally selected. Appropriate anions include anions of benzenesulfonic acid, toluenesulfonic acid, 4-(4-toluenesulfonyloxy)benzenesulfonic acid, pentafluorobenzenesulfonic acid, 2,2,2-trifluoroethanesulfonic acid, nonafluorobutanesulfonic acid, heptadecafluorooctanesulfonic acid, camphorsulfonic acid, disulfonic acid, sulfonyl imide, and sulfonyl methaneide.

The photoacid generator (C) is added to the chemically amplified positive resist composition in an amount of 0.5 to 20 parts, preferably 1 to 10 parts by mass of the component (A). The PAG may be used alone or in admixture of two or more.

Examples of the organic solvent of the chemically amplified positive photoresist composition include ethylene glycol monoalkylethers such as ethylene glycol monomethylether and ethylene glycol monoethylether; ethylene glycol monoalkylether acetates such as ethylene glycol monomethylether acetate and ethylene glycol monoethylether acetate; propylene glycol monoalkylethers such as propylene glycol monomethylether (PGME) and propylene glycol monoethylether; propylene glycol monoalkylether acetates such as propylene glycol monomethylether acetate and propylene glycol monoethylether acetate; propylene glycol dialkyl ethers such as propylene glycol dimethyl ether (PGDME), propylene glycol diethyl ether, propylene glycol dipropyl ether, propylene glycol dibutyl ether; lactic acid esters such as methyl lactate, ethyl lactate, n-propyl lactate, isopropyl lactate, n-butyl lactate, isobutyl lactate; aromatic hydrocarbons such as toluene and xylene; aliphatic carboxylic acid esters such as methyl formate, ethyl formate, n-propyl formate, isopropyl formate, n-butyl formate, isobutyl formate, n-amyl formate, isoamyl formate, methyl acetate, ethyl acetate, n-propyl acetate, isopropyl acetate, n-butyl acetate (nBA), isobutyl acetate (IBA), n-amyl acetate, isoamyl acetate, n-hexyl acetate, methyl propionate, ethyl propionate, n-propyl propionate (PP), isopropyl propionate, n-butyl propionate, isobutyl propionate, methyl butyrate, ethyl butyrate, n-propyl butyrate, isopropyl butyrate, n-butyl butyrate, isobutyl butyrate; ketones such as methylethylketone, 2-heptanone, methyl isobutyl ketone (MIBK), ethylpropylketone, n-butylethyl ketone, tert-butylethyl ketone, and cyclohaxanone; ethers such as isopropyl ether, n-butyl ether, cyclopentyl methyl ether (CPME), furfural, tetrahydrofuran, dioxane, and benzofuran; amides such as N,N-dimethylacetamide and N-methylpyrrolidone; and lactones such as [gamma]-butylolactone. These solvents may be used singly or as a mixture of two or more solvents.

At least one of the organic solvent of the chemically amplified positive photoresist composition has viscosity less than 1.0 mPa·s at 25° C. Examples of organic solvent with viscosity less than 1.0 mPa·s at 25° C. include ketone solvents such as acetone, methylethylketone, methylisobutylketone, methyl-n-butylketone, methyl-n-pentylketone, diisobutylketone; ether solvents such as diethylether, cyclopentyl methyl ether, dibutyl ether; aliphatic hydrocarbon solvents such as pentane, hexane, heptane, octane; cycloaliphatic hydrocarbon solvents such as cyclohexane, methylcyclohexane; aromatic hydrocarbon solvents such as; benzene, toluene, xylene; ester solvents such as; methyl acetate, ethyl acetate, n-propyl acetate, isopropyl acetate, n-butyl acetate, isobutyl acetate, n-pentyl acetate, propyl propionate ethylene glycol solvent such as ethylene glycol dimethyl ether; propylene glycol dimethyl ether; diethyl carbonate.

Preferable combination of the organic solvents are propylene glycol monomethylether and propylene glycol dimethyl ether, propylene glycol monomethylether and methylisobutylketone, propylene glycol monomethylether and methylethyl ketone, propylene glycol monomethylether and n-butyl acetate, propylene glycol monomethylether and cyclopentyl methyl ether, propylene glycol monomethylether and propyl propionate.

An amount of the organic solvent used is desirably 1 to 20 times, more desirably 1 to 15 times the amount of total solids on a weight basis.

Examples of basic compounds (E) include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, and imide derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, N,N,N',N'-tetramethyltetraethylenepentamine, Tris[2-(dimethylamino)ethyl]amine, Tris[2-(isopropylamino)ethyl]amine, N,N-diisopropyl-N-methylamine, N,N,N,N,N-Pentamethyldiethylenetriamine, 1,1,4,7,10,10-Hexamethyltriethylenetetramine, tris-(2-(3-methyl-butoxy)-ethyl)-amine, tris-(2-hexyloxy-ethyl)-amine, 1,4-diazabicyclo[2.2.2]octane, and tris[2-(2-methoxyethoxy)ethyl]amine.

Examples of suitable mixed amines include dimethylethylamine, methylethylpropylamine, diisopropylmethylamine, N-ethyl-N-isopropyl-2-propanamine, N-methyldicyclohexylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, tris-(2-phenoxy-ethyl)-amine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethyl propyl)pyridine, aminopyridine, and dimethylaminopyridine), pyridazine derivatives, pyrimidine derivatives, pyrazine derivatives, pyrazoline derivatives, pyrazolidine derivatives, piperidine derivatives (e.g., N-(2-propanol)-3,5-dihydroxypiperidine), piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

The basic compounds may be used alone or in admixture of two or more. The basic compound (E) is preferably formulated in an amount of 0 to 2 parts, and more preferably 0.01 to 1 part by mass per 100 parts by mass of the component (A). More than 2 parts of the basic compound may result in too low on sensitivity.

The chemically amplified positive resist composition according to the present invention may further contain, if desired, other additives such as dyes, leveling agents, adhesive aids and surfactants. Examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Tohkem Products Co., Ltd.), Megafac F171, F172, F173 and F-563 (DIC Corp.), Fluorad FC-430 and FC-431 (Sumitomo 3M Co., Ltd.), Surfynol E1004 (Nissin Chemical Industry Co., Ltd.), Asahiguard AG710, Surflon S-381, S-382, SC101, SC102, SC103, SC104, SC105, SC106, KH-10, KH-20, KH-30 and KH-40 (AGC Seimi Chemical Co., Ltd.); organosiloxane polymers KP341, X-70-092, X-70-093, and KF-53 (Shin-Etsu Chemical Co., Ltd.), acrylic acid or methacrylic acid Polyflow No. 75 and No. 95 (Kyoeisha Ushi Kagaku Kogyo Co., Ltd.). Inter alia, FC-430, Surflon S-381, Surfynol E1004, KH-20 and F-563 are preferred. These surfactants may be used alone or in admixture.

In the chemically amplified resist composition, the surfactant is formulated in an amount of up to 2 parts, and preferably up to 1 part by mass per 100 parts by mass of the component (A).

EXAMPLES

The examples below serve to illustrate the invention without limiting it. Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever. Unless otherwise stated in particular, the "part" represents part by mass and "%" represents % by mass.

Examples 1 to 18

A chemically amplified positive photoresist composition was prepared by selecting a polymer as base resin, an acid generator, a basic compound, and a surfactant in accordance with the formulation shown in Table 1, dissolving them in organic solvents, and filtering through a membrane having a pore size of 0.05 μm. The chemically amplified positive photoresist composition was spin coated on an 8-inch silicon wafer (Mark-8, Tokyo Electron Ltd.) and prebaked at 150° C. for 180 seconds to remove the solvent to form a chemically amplified positive photoresist film with 9 μm in film thickness. Results on crack resistance test are shown in Table 2.

The photoresist film with 7.5 μm in film thickness was formed by dispensing the chemically amplified positive photoresist composition to an 8 inch silicon wafer (Mark-8, Tokyo Electron Ltd.) and prebaked at 150° C. for 180 seconds to remove the solvent. Using a KrF stepper FPA 3000-EX5 (Canon Inc.), the photoresist film was exposed to KrF ray through a reticle. The photoresist film was baked (PEB) at 110° C. for 180 seconds and developed with a 2.38 wt % tetramethylammonium hydroxide aqueous solution (AZ300MIF Developer). Specifically, development was carried out by dispensing the developer to the substrate for 5 seconds while spinning the substrate, and holding the developer stationary on the photoresist film for 90 seconds. This was followed by deionized water rinsing and drying. The photoresist pattern resulting from development was observed under a scanning electron microscope (SEM). It was confirmed whether or not the pattern deformed and/or collapsed and the presence of scum and the pattern profile. Results are shown in Table 2.

Comparative Examples 1 to 9

A chemically amplified positive photoresist composition was prepared as in Examples aside from using a different polymer or a different formulation shown in Table 1, dissolving them in organic solvents, and filtering through a membrane having a pore size of 0.05 μm. The chemically amplified positive photoresist composition was spin coated on an 8-inch silicon wafer (Mark-8, Tokyo Electron Ltd.) and prebaked at 150° C. for 180 seconds to remove the solvent to form a chemically amplified positive photoresist film with 9 μm in film thickness. Results on crack resistance test are shown in Table 2.

The photoresist pattern preparation and its observation were conducted as in Examples. Results are shown in Table 2.

Examples 19 to 24 and Comparative Example 10

A chemically amplified positive photoresist composition was prepared by selecting a polymer as base resin, an acid generator, a basic compound, and a surfactant in accordance with the formulation shown in Table 1, dissolving them in organic solvents, and filtering through a membrane having a pore size of 0.05 μm. Viscosity of the composition was adjusted to 98 mPa·s at 25° C. The chemically amplified positive photoresist composition was spin coated on an 8-inch silicon wafer (Mark-8, Tokyo Electron Ltd.) at 1000 rpm and prebaked at 150° C. for 180 seconds to remove the solvent to form a chemically amplified positive photoresist film. The film thickness was measured by using Spectrometric Film Thickness Measurement System VM-1210 (Screen Semiconductor Solutions Co., Ltd.). Results are shown in Table 3.

Example 25 and Comparative Example 11

A photoresist film was formed by dispensing the chemically amplified positive photoresist composition to an 8 inch silicon wafer (Mark-8, Tokyo Electron Ltd.) and prebaked at 150° C. for 180 seconds to remove the solvent. Film thickness was measured by using VM-1210 (Screen Semiconductor Solutions Co., Ltd.). Using a KrF stepper FPA 3000-EX5 (Canon Inc.), the 7.5 μm photoresist film was exposed to KrF ray through a reticle. The exposed silicon wafer was allowed to stand in a clean room (25° C., 50% RH) for 1 minutes and 30 minutes. The 7.5 μm photoresist film was baked (PEB) at 110° C. for 180 seconds and developed with a 2.38 wt % tetramethylammonium hydroxide aqueous solution (AZ300MIF Developer). Pattern profile observation and measurement of size of line and space of the pattern were conducted under a SEM.

(PAG-1)
(PAG-2)
(PAG-3)
(PAG-4)
(PAG-5)
(PAG-6)
(PAG-7)

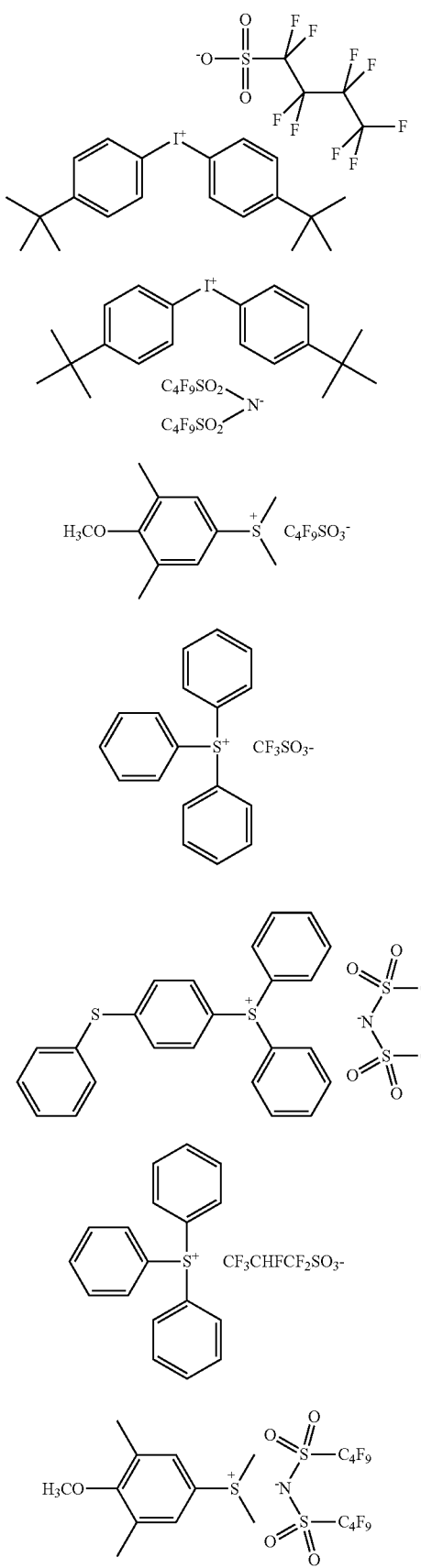

(PAG-8)
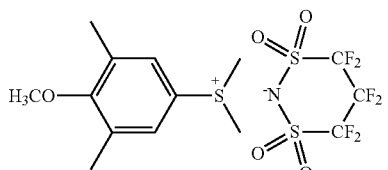

(Base-1)
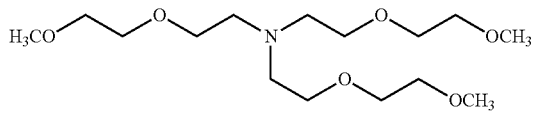

(Base-2)
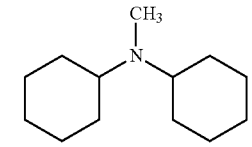

(Base-3)
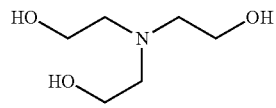

(Base-4)
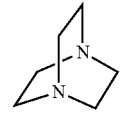

(Base-5)
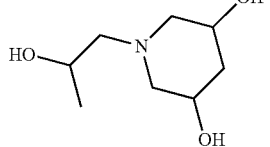

Lutonal M40: Polyvinylmethyl ether Mw 50,000 (BASF)
Mowital B16H: Polyvinyl butyral Mw 10,000-20,000 (Kuraray Co. Ltd.)
RS700: Polyether ester Mw 550 (ADEKA Co.)

Synthesis Example 1

In 100 g of dioxane were dissolved 60 g of vinylphenol, 21.3 g of tert-butyl acrylate and 17.3 g of styrene, and then 8.3 g of 2,2'-azobisisobutyronitrile was added thereto, after which the resulting solution was bubbled with a nitrogen gas for 30 minutes. Thereafter, the solution was heated to 60° C. while the bubbling was continued to effect polymerization for seven hours. After the polymerization, the solution was poured into a large amount of hexane to coagulate the polymer and the polymer was then recovered. The polymer was dissolved in acetone and then the resulting solution was poured into hexane again to coagulate the polymer. This operation was repeated several times to remove completely the unreacted monomers, after which the polymer was dried at 50° C. under vacuum overnight. The polymer thus obtained was white and the yield was 58%. As a result of 1H-NMR and 13C-NMR analyses, it was found that the composition of the polymer was such that vinylphenol, tert-butyl acrylate and styrene were copolymerized at a proportion of approximately 3:1:1. Mw was 12,000 and Mw/Mn was 2.8. This polymer is referred to hereinafter as Polymer (1).

Synthesis Example 2

In 100 g of dioxane were dissolved 50 g of vinylphenol, 14.8 g of tert-butyl methacrylate and 21.7 g of styrene, and then 7.7 g of 2,2'-azobisisobutyronitrile was added thereto, after which the resulting solution was bubbled with a nitrogen gas for 30 minutes. Thereafter, the solution was heated to 60° C. while the bubbling was continued to effect polymerization for ten hours. After the polymerization, the solution was poured into a large amount of hexane to coagulate the polymer and the polymer was then recovered. The polymer was dissolved in acetone and then the resulting solution was poured into hexane again to coagulate the polymer. This operation was repeated several times to remove completely the unreacted monomers, after which the polymer was dried at 50° C. under vacuum overnight. The polymer thus obtained was white and the yield was 58%. As a result of 1H-NMR and 13C-NMR analyses, it was found that the composition of the polymer was such that vinylphenol, tert-butyl methacrylate and styrene were copolymerized at a proportion of approximately 4:1:2. Mw was 36,000 and Mw/Mn was 3.2. This polymer is referred to hereinafter as Polymer (2).

Synthesis Example 3

In 100 g of dioxane were dissolved 60 g of vinylphenol, 9.1 g of tert-butyl acrylate and 25.2 g of 4-tert-butoxystyrene, and then 8.3 g of 2,2'-azobisisobutyronitrile was added thereto, after which the resulting solution was bubbled with a nitrogen gas for 30 minutes. Thereafter, the solution was heated to 60° C. while the bubbling was continued to effect polymerization for seven hours. After the polymerization, the solution was poured into a large amount of hexane to coagulate the polymer and the polymer was then recovered. The polymer was dissolved in acetone and then the resulting solution was poured into hexane again to coagulate the polymer. This operation was repeated several times to remove completely the unreacted monomers, after which the polymer was dried at 50° C. under vacuum overnight. The polymer thus obtained was white and the yield was 62%. As a result of 1H-NMR and 13C-NMR analyses, it was found that the composition of the polymer was such that vinylphenol, tert-butyl acrylate and 4-tert-butoxystyrene were copolymerized at a proportion of approximately 7:1:2. Mw was 12,200 and Mw/Mn was 2.9. This polymer is referred to hereinafter as Polymer (3).

Molecular Weight Measurement

Weight average molecular weight was determined by gel permeation chromatography (GPC) using GPC columns and under analysis conditions involving a flow rate of 1.0 mL/min, an elution solvent of tetrahydrofuran and a column temperature of 40° C. using mono-dispersed polystyrene as a standard.

Viscosity Measurement

Viscosity was measured by Cannon-Fenske viscometer (VMC-45, Rigo Co., Ltd.) at 25° C.

Crack Resistance Test

A photoresist film was formed by dispensing a chemically amplified positive photoresist composition to an 8 inch silicon wafer (Mark-8, Tokyo Electron Ltd.) and prebaked at 150° C. for 180 seconds to remove the solvent. The film thickness was measured by using Spectrometric Film Thickness Measurement System VM-1210 (Screen Semiconductor Solutions Co., Ltd.). The photoresist film surface was observed under an optical microscope.

The invention claimed is:

1. A chemically amplified positive photoresist composition comprising (A) an alkali-soluble resin, (B) at least one plasticizer selected from a group consisting of an alkali-soluble vinyl resin and an acid-dissociable group containing vinyl resin, (C) a photo acid generator, (D) an organic solvent, and (E) a basic compound; wherein the alkali-soluble resin (A), comprises a polymer comprising recurring units represented by a general formula (1), a general formula (2) and a general formula (3) and has a weight average molecular weight of 1,000 to 200,000;

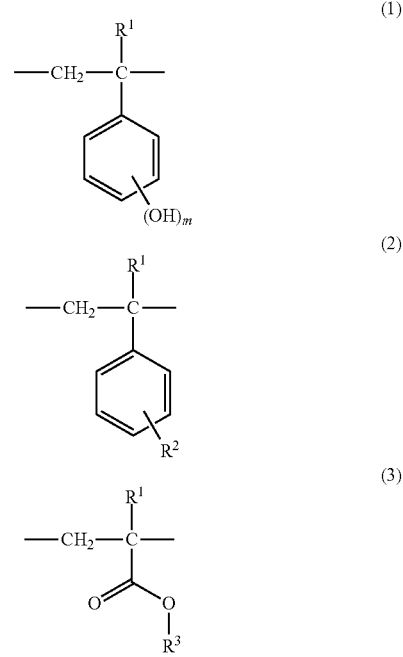

wherein R1 is hydrogen, alkyl or halogen, R2 is hydrogen or alkyl, R3 is C4-C12 tertiary alkyl, m is a positive integer of 1 to 5;

the amount of the plasticizer (B) in the composition is 2-10 parts by mass per 100 parts by mass of the alkali-soluble resin (A);

the amount of the photoacid generator (C) in the composition is 1 to 10 parts by mass per 100 parts by mass of the alkali-soluble resin (A);

the amount of the base (E) in the composition is 0.01-1 parts by mass per 100 parts by mass of the alkali-soluble resin (A); and the organic solvent (D) is selected from the group consisting of propylene glycol monomethylether arid propylene glycol dimethyl ether mixture, propylene glycol monomethylether and methylisobutylketone mixture, propylene glycol monomethylether and methylethylketone mixture, propylene glycol monomethylether arid n-butyl acetate mixture, propylene glycol monomethylether and cyclopentyl methyl ether mixture, and propylene glycol monomethylether and propyl propionate mixture.

2. The chemically amplified positive photoresist composition according to claim 1 wherein the alkali-soluble vinyl resin and the acid-dissociable group containing vinyl resin (B) has a weight average molecular weight of 500 to 200,000.

3. The chemically amplified positive photoresist composition according to claim 1 wherein the alkali-soluble vinyl resin and the acid-dissociable group containing vinyl resin (B) is selected from a polyvinyl ether, a polyvinyl butyral and a polyether ester and mixtures thereof.

4. The chemically amplified positive photoresist composition according to claim 1 wherein the organic solvent comprising a solvent with viscosity less than 1.0 mPa·s at 25° C.

5. The chemically amplified positive photoresist composition according to claim 1 wherein the polymer comprising recurring units represented by the general formula (1), the general formula (2) and the general formula (3) included in the alkali-soluble resin (A) is a polymer comprising recurring units represented by a formula (4), a formula (5) and a formula (6) and having a weight average molecular weight of 4,000 to 200,000.

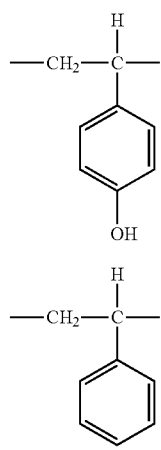

(4)

(5)

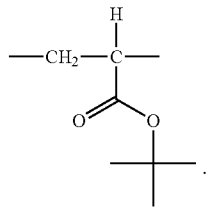

(6)

6. The use of a chemically amplified positive photoresist composition according to claim 1 for manufacturing a semiconductor device.

7. A method for forming a resist pattern, comprising:
 a) coating the chemically amplified positive photoresist composition according to claim 1 onto a substrate and prebaking to form a resist film;
 b) exposing the resist film to UV radiation having a wavelength of up to 500 nm through a photomask; and
 c) optionally baking, and developing with a developer to form a resist pattern.

8. The method for forming a resist pattern according to claim 7, wherein UV radiation having the wavelength of 248 nm.

9. A semiconductor device manufacturing method comprising a method for forming a resist pattern according to claim 7.

* * * * *